Aug. 21, 1962 N. SCLAR 3,050,684

SELF-POWERED SEMICONDUCTOR OSCILLATORS

Filed Oct. 5, 1959 3 Sheets-Sheet 1

INVENTOR.
NATHAN SCLAR

BY Karl Huber
James E Bryan
Alan C. Rose
ATTORNEYS

INVENTOR.
NATHAN SCLAR
BY Karl Huber
James E. Bryan
Alan C. Rose
ATTORNEYS

Aug. 21, 1962 N. SCLAR 3,050,684

SELF-POWERED SEMICONDUCTOR OSCILLATORS

Filed Oct. 5, 1959 3 Sheets-Sheet 3

INVENTOR.
NATHAN SCLAR

BY Karl Haber
James E. Bryan
Alan C. Rose
ATTORNEYS

1

3,050,684
SELF-POWERED SEMICONDUCTOR OSCILLATORS

Nathan Sclar, Glen Rock, N.J., assignor to Nuclear Corporation of America, Denville, N.J., a corporation of Delaware Filed Oct. 5, 1959, Ser. No. 844,275
7 Claims. (Cl. 325—105)

This invention relates to oscillators and more specifically to self-powered oscillators of the semiconductor type.

Principal objects of the present invention include simplification and reduction in the size of self-powered oscillators.

Another object of the present invention is to provide a single solid state device which will both generate a direct current and convert this direct current into alternating current signals.

In accordance with one illustrative embodiment of the invention, a wafer of p-type semiconductive material may be provided with a thin layer of n-type material on its upper and lower surfaces. It may be noted in passing that pure or "intrinsic" semiconductors such as germanium or silicon may be made n-type or p-type by the addition of small percentages of elements from the fifth or third column, respectively, of the periodic table. The "doping," or adding of impurities may be either heavy or light as required. In the present case a heavy doping of both the n-type and p-type zones is employed in order to produce a p-n diode having a negative resistance characteristic in the "forward" direction. Such diodes are disclosed in a paper entitled, "New Phenomenon in Narrow Germanium p-n Junctions," by Leo Esaki, which appeared at pages 603 and 604 of the Physical Review, vol. 109, No. 2, 1958. These semiconductor elements are frequently referred to as either Esaki or tunnel diodes.

Now, in accordance with one aspect of my invention, I have discovered that the doping requirements for a negative resistance p-n diode are comparable to those for a p-n junction "solar battery." Furthermore, the voltage provided by a single solar battery cell is sufficient to operate the negative resistance diode as an oscillator, when it is provided with a suitable tuned load.

Referring again to the p-type semiconductor wafer with upper and lower n-type layers, a low impedance tuned circuit is connected across the upper and lower semiconductor layers by ohmic connections. Then, when light is directed onto the thin layer overlying one of the p-n junctions, a biasing voltage is applied to the other diode through the external tuned circuit, and its negative resistance characteristic produces oscillations at the frequency established by the tuned circuit connected across the two p-n junctions.

In accordance with another illustrative embodiment of the invention, a semiconductor thermoelement has an n-type leg and a p-type leg which have a hot junction and a cold junction. At the cold junction, the two semiconductor legs of different conductivity type are properly doped and joined to form a negative resistance diode of the type described above. A tuned circuit is then connected by ohmic connections to the two legs. These requirements may be conveniently implemented by the use of a doped solder joint between the n-type and p-type material. The doped solder makes a rectifying junction with one of the legs and an ohmic connection to the other leg. One connection to the tuned circuit is conveniently made to the doped solder, and the other connection to the tuned circuit is an ohmic connection to the leg which makes a rectifying junction with the solder. When heat is applied to the hot junction of the thermoelement, the voltage which appears across the negative resistance diode produces oscillations in the tuned circuit.

2

In accordance with a feature of the invention, a self-powered semiconductor oscillator includes a body of semiconductive material of one conductivity type, a negative resistance junction with the semiconductive body and material of the other conductivity type, and a second junction of the body of semiconductive material of one conductivity type with material of the other conductivity type such that voltage is supplied to the negative resistance junction when energy is applied to the second semiconductive junction. In addition, a tuned load circuit is connected across the negative resistance junction.

In accordance with additional features of the invention, the power supplying junction as recited in the preceding paragraph may be a solar battery, or it may be the hot junction of a thermoelement.

As another feature of the invention, it is contemplated that the semiconductive devices of the preceding paragraphs may be connected in parallel to increase the alternating current power output.

Other objects, features and advantages of the present invention will become apparent from a consideration of the following detailed description, the claims, and the drawings, in which:

Figure 1:
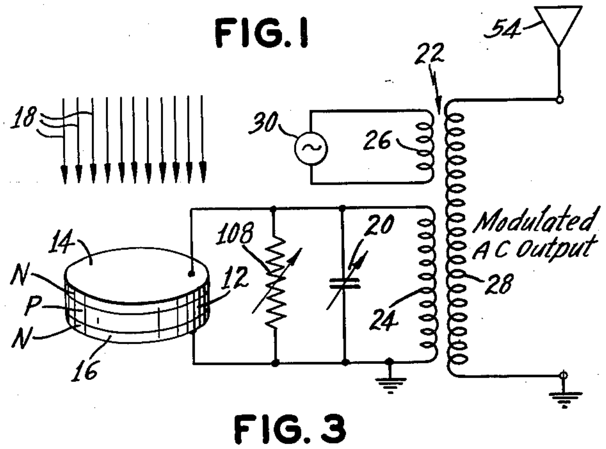
FIG. 1 is a schematic showing of a self-powered semiconductor oscillator in accordance with the present invention.

With reference to the drawings, FIG. 1 shows a main body of p-type semiconductor material 12 having an upper layer of n-type material 14 and a lower layer of n-type semiconductor material 16. The upper and lower n-type layers are shown considerably thicker than they would actually be in practice. These layers are formed by diffusing a small layer of an appropriate impurity into the disc of p-type material. By way of specific example, when the original wafer is of p-type silicon, the n-type layers may be produced by the vapor diffusion of elements from the fifth column of the periodic table into the p-type silicon. Solar battery cells using p-n junctions of this type are known to have a moderately high efficiency of about 12 percent in the conversion of sunlight energy into direct current. The exposure of the junction between n-type layer 14 and the p-type material 12 to sunlight passing through the layer 14 is indicated schematically by the arrows 18.

The junction between the p-type disc 12 and the lower n-type layer 16 is of the type described in the article cited above. The heavy doping of the p and n-type materials required for the production of a negative resistance diode of this type is entirely compatible with the doping conditions which are preferred for solar batteries. In some cases therefore, it may be convenient to vapor diffuse an n-type layer on all surfaces of a p-type plate or disc and then merely machine off the n-type layer on the sides of the p-type slab. Alternatively, the n-type doping for the negative resistance diode 12—16 in FIG. 1 and the solar battery diode 12—14 may be accomplished individually to optimize the properties of each junction.

The parallel tuned circuit including condenser 20 and transformer 22 is connected ohmically to the two n-type layers 14 and 16. The transformer 22 includes the primary windings 24 and 26 and the secondary winding 28. The transformer 22 may have a suitable high frequency core to permit modulation by the primary winding 26 in accordance with signals from the alternating signal source 30.

The mode of operation of the circuit of FIG. 1 and the criterion which must be satisfied to permit oscillation will be discussed in detail at a later point in this specification.

Figure 2:
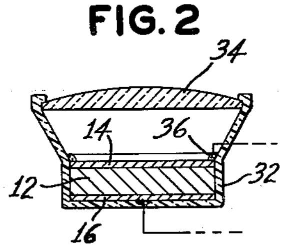
FIG. 2 represents an assembly incorporating a part of the system of FIG. 1.

FIG. 2 shows the semiconductor structure 12, 14 and 16 according to a scale which more closely approximates that which is actually employed. The lower junction between the semiconductor portions 12 and 16 is protected by the opaque insulating casing 32. The casing 32 includes means for directing light upon the surface layer 14 of the solar battery cell. While a suitable window in the casing is adequate, the lens 34 may also be employed to direct sunlight of greater intensity onto the surface of the solar battery. The ohmic connection 36 to the n-type material 14 may be in the form of a ring around the edge of the surface. In this manner, good contact is assured without interfering with the passage of sunlight to the p-n junction between the elements 12 and 14.

Figure 3:
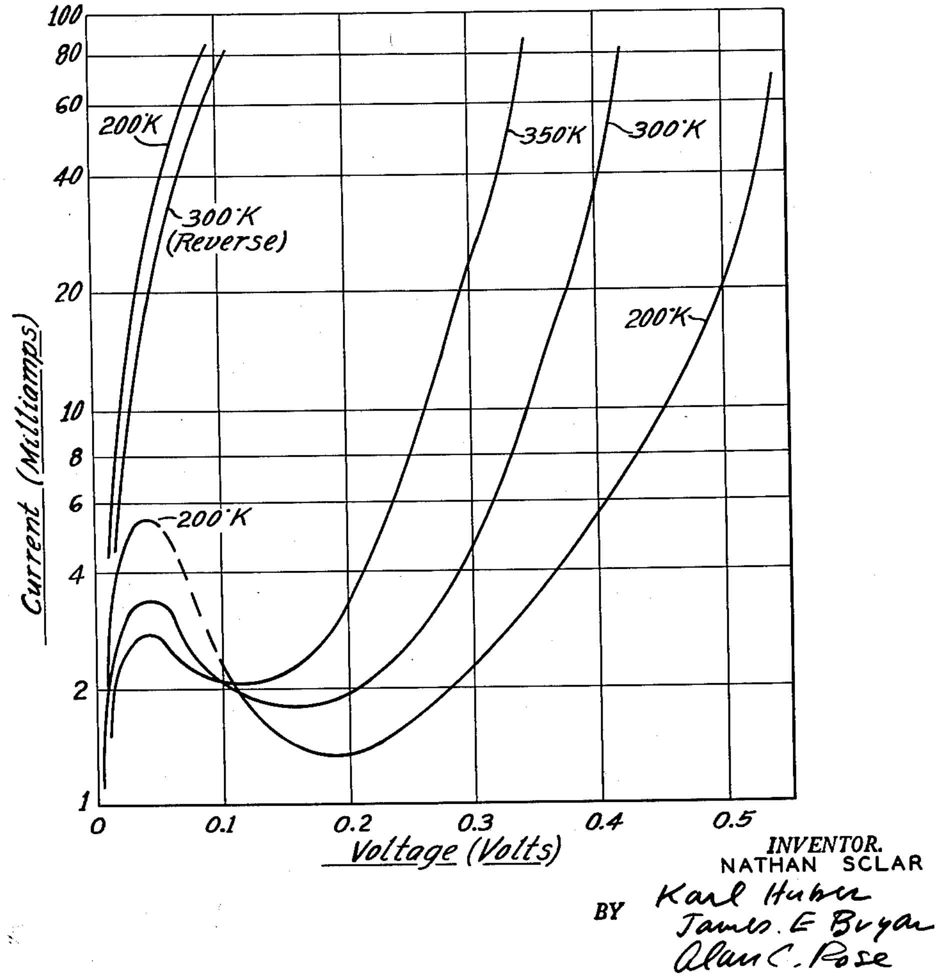
FIG. 3 shows electrical characteristic curves for the negative resistance junction forming part of the system of FIG. 1.

FIG. 3 shows the negative resistance characteristic curves for diodes made as proposed by Mr. Esaki in the article cited above. The negative resistance portion of the curve lies between two positive resistance sections in the normal manner for negative resistance devices. One of the principal matters of importance for the present invention which may be noted from these curves is the low values of current and voltage at which the negative resistance regions occurs.

Figure 4:
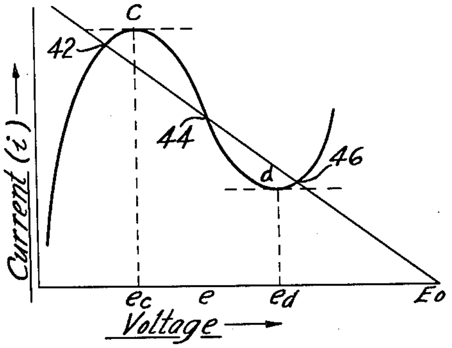
FIGS. 4 and 5 are plots of electrical characteristics of the system of FIG. 1 which relate particularly to conditions necessary to sustain oscillations.
Figure 5:
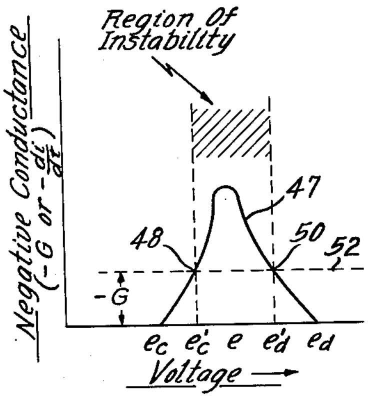

FIGS. 4 and 5 are plots of electrical characteristics which will be employed to establish oscillation criteria for the systems of the present invention. FIG. 4 is an enlarged current-voltage plot of the negative resistance region of one of the curves of FIG. 3.

The region of negative resistance is a region of instability which may be used to generate alternating current from a direct current power source. To show that this region is unstable, consider an element with a negative resistance characteristic in series with an ohmic resistance R and a voltage source $E_0$. The voltage across the element is $E=E_0-IR$ where I is the circuit current. A generalized current voltage characteristic of the device, together with the resistance load line, is shown in FIG. 4. The only values of current that can be obtained with the given supply voltage and resistance are those corresponding to the intersections of these curves at points 42, 44, and 46. If the current and voltage have values corresponding to point 44, any small increase of current due to any cause is accompanied by a decrease of voltage across the element. More voltage is thus made available to send current through the resistance, and so the current rises farther. The action is cumulative, the current rising until point 42 is reached. Any further increase of current above that corresponding to point 42 would necessarily be accompanied by an increase of voltage across the element. The voltage across the resistance would therefore have to fall, which could be true only if the current became smaller. Hence the current would return to the value corresponding to stable point 42.

A similar analysis shows that if the current initially corresponds to point 44, any small initial decrease of current becomes cumulative, and so the current falls to point 46, which is stable. The region of instability is thus the region of negative resistance or conductance, represented by the symbol "$g$." This is shown by the plot 47 in FIG. 5 and is obtained by the negative derivative of the plot of FIG. 4. To sustain oscillations in the region of instability, it is necessary to provide a tuned external circuit of conductance G which is less than the absolute value of the peak value of $-g$ as shown in FIG. 5. The amplitude of the potential oscillations is then $(e'_c-e'_d)$ where $e'_c$ and $e'_d$ are the voltages at the intercepts 48 and 50 of the horizontal line 52 representing the external conductance G.

The smaller the external conductance, the larger is the magnitude of the oscillations up to the limit $(e_d-e_c)$. To achieve a minimum conductance, a parallel resonance circuit is indicated. Such a circuit is shown in FIG. 1 where the direct current power input of the solar energy converter is shown in series with the negative resistance diode. Alternatively, the steady voltage may be applied in parallel with the diode. The inductance and capacitance are chosen to be resonant at the desired frequency. In this arrangement the oscillation sustaining condition is $$/-g/>RC/_{\mathrm{L}}=\frac{1}{{}_{\mathrm{Q}}2_{\mathrm{R}}}$$

where $/-g/$ is the absolute value of the peak value of negative conductance of the negative resistance diode, R is the resistance of the inductor, C is the capacitance, L is the inductance, and Q refers to the ratio of the reactance of the inductor (or transformer) to its resistance. For an order of magnitude evaluation of the stringency of this condition we take a marginal low-value of $g \doteq 2\times10^{-3}$ mhos. (see FIG. 3) for the element internal conductance and assume a coil resistance of 10 ohms. Oscillations may therefore be sustained even with a value of Q which is less than 10. With the higher values of Q for the tuned circuit which are readily obtainable, the efficiency of conversion increases.

Figure 6:
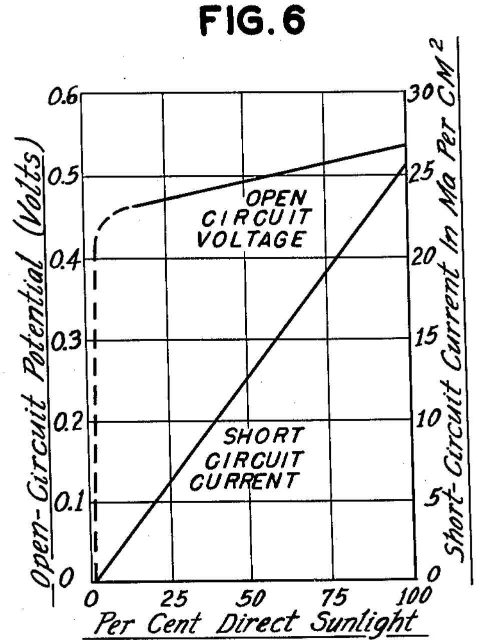
FIGS. 6 and 7 are electrical characteristic curves for solar batteries.
Figure 7:
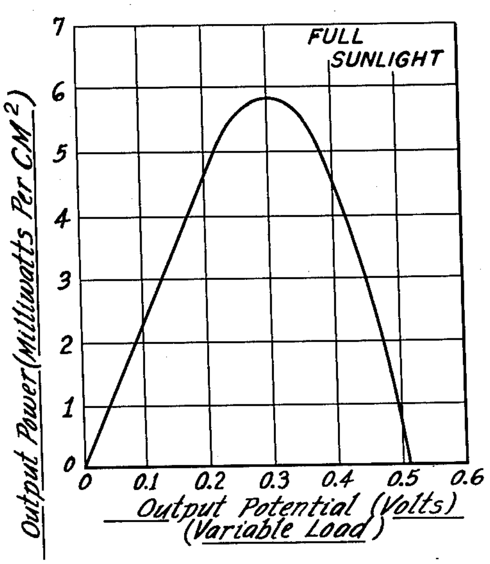

FIGS. 6 and 7 show an open circuit voltage characteristic and short-circuit current characteristic of a solar cell of the type mentioned above, as a function of the incident sunlight. Depending on the circuit loading, the voltage output varies from 0–.55 volt. In FIG. 7 the maximum power output is shown to be obtained at 0.3 volt, which is ideally positioned with respect to the region of negative resistance for the Esaki negative resistance diode in silicon.

Referring again to FIG. 1, therefore, the potential developed across the solar battery p-n junction 12—14 is approximately correct for high efficiency utilization by the negative resistance p-n junction 12—16. Furthermore, oscillations are sustained in the circuit by the low impedance tuned circuit including capacitor 20 and the step-up transformer 22. The modulated signals from the secondary 28 of the transformer 22 may be applied to a suitable load such as the antenna 54.

Figure 8:
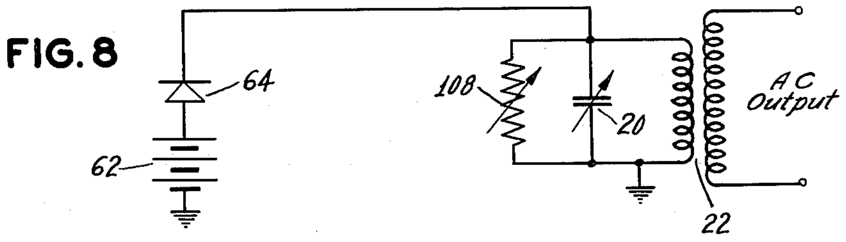
FIG. 8 is an equivalent circuit diagram of the system of FIG. 1, with the modulation circuit omitted.

FIG. 8 is an equivalent circuit representation for the system shown in FIG. 1, with the exception that the modulation circuitry 26, 30 of FIG. 1 is not shown. In FIG. 8, the battery 62 corresponds to the solar battery junction 12—14 of FIG. 1. The diode 64 of FIG. 8 corresponds to the Esaki negative resistance diode 12—16 of FIG. 1. The capacitor 20 and transformer 22 of FIG. 8 correspond closely to the same circuit elements of FIG. 1, and therefore bear the same numbers.

As discussed below, the potential source shown at 62 in FIG. 8 may be implemented by another form of direct current generator. More specifically, a thermo-element may be employed instead of the solar battery disclosed above.

Figure 9:
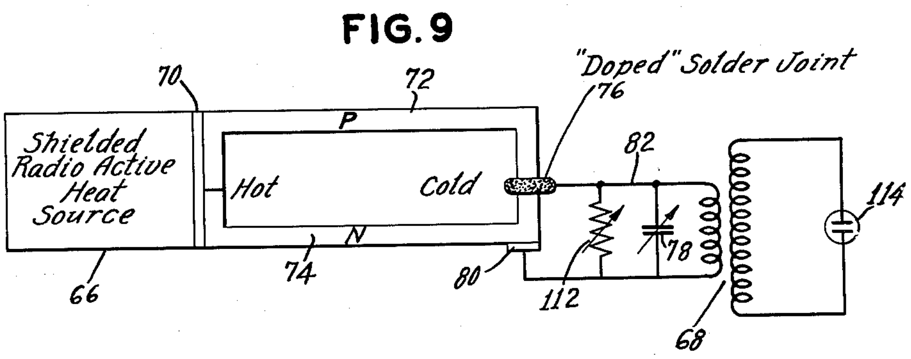
FIG. 9 shows a system in accordance with the invention which employs thermoelectric and negative resistance phenomena.

In the circuit of FIG. 9, heat from the source 66 is converted into alternating current output signals which appear at the secondary of transformer 68. The conducting member 70 bridges the ends of the p-type semiconductor leg 72 and the n-type semiconductor leg 74 of a thermoelement. The two ends of the legs 72 and 74, in combination with the conducting plate 70 with which they are in contact, form the hot junction of the thermoelement. In this regard it may be noted in passing that the p-type and n-type materials do not actually have to touch each other at the hot junction as long as they are both maintained hot and in electrical contact with the bridging plate 70. The source of heat may, for example, be a 100 curie radioactive polonium source. The polonium source should be well shielded to avoid undesired radiations, which would both reduce the heat generated in the source 66 and could produce undesirable external effects.

A negative resistance diode is formed at the cold junction of the p-type semiconductor leg 72 and the n-type leg 74. This junction is accomplished by the use of a doped solder joint 76. The solder 76 makes an ohmic connection with the p-type material 72 and rectifying contact with the n-type semiconductor leg 74. When n- and p-type germanium or silicon are employed, a solder joint of this type may be employed through the use of conventional solders, such as a lead-tin solder, doped with inidium, a p-type impurity from column 3 of the periodic table. With the p-type impurity in the solder, an ohmic connection is formed to the p-type material 72. At the surface of the n-type material 74 however, a thin layer of p-type material diffuses into the n-type semiconductor material 74. The negative resistance p-n junction is therefore formed at the interface between the leg 74 and the solder 76.

The same general technique may also be employed with better thermoelectric materials such as n-type and p-type bismuth telluride. Bismuth telluride may be made n-type or p-type by deviations from stoichiometry. With excess tellurium the semiconductor becomes n-type, and with excess bismuth it is p-type. When these materials are employed, the doped solder may be composed of lead with bismuth added. This solder then produces an ohmic contact to the p-type material 72 and a rectifying junction with the n-type material 74.

The tuned circuit made up of the capacitor 78 and the transformer 68 is ohmically connected at terminal 80 to the n-type leg 74 of the thermoelement. The other connection 82 from the tuned circuit is connected to the doped solder bead 76, and therefore makes an ohmic connection to the p-type material 72 and a rectifying connection to the n-type leg 74.

When the radioactive source heats up the conducting plate 70, the difference in temperature between the hot junction of the thermoelement 72, 74, and the cold junction produces a direct current across the negative resistance diode. Oscillations then take place at a frequency determined by the tuned circuit made up of the capacitor 78 and transformer 68. The mechanism of the oscillation is substantially the same as described above in connection with the solar battery cell.

Figure 10:
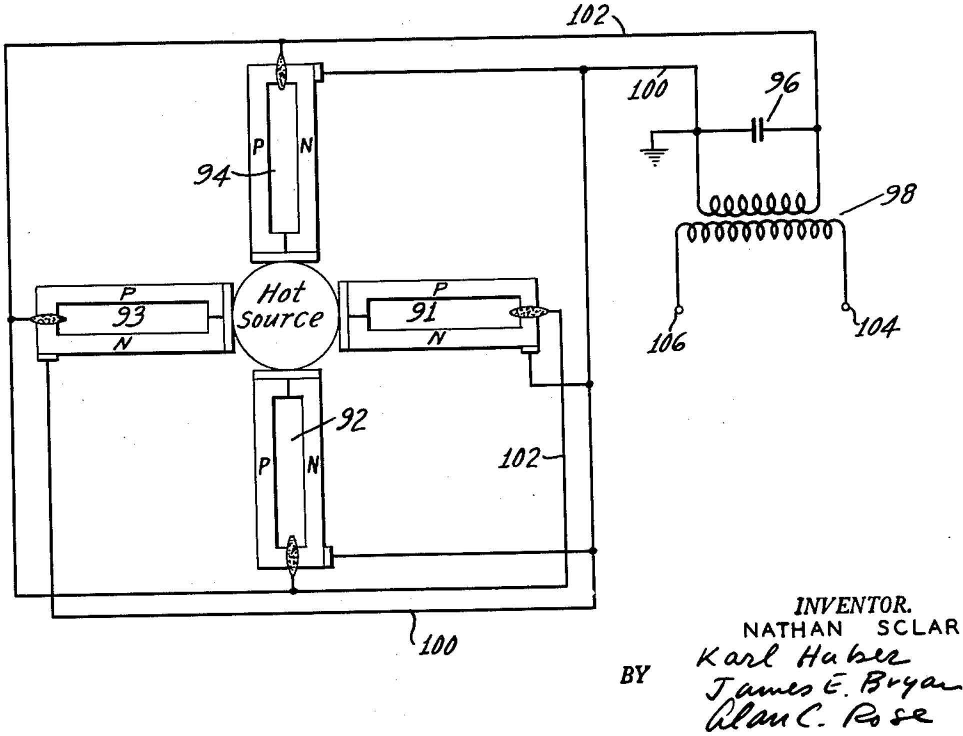
FIG. 10 represents a system of the invention, in which a number of the semiconductor devices of FIG. 9 are connected in parallel.

FIG. 10 shows a plurality of thermoelectric and negative resistance units 91 through 94, having their output circuits connected in parallel. A single tuned circuit including the capacitor 96 and the step-up transformer 98 is employed. Ohmic connections from the negative legs of all of the assemblies 91 through 94 are connected to one lead 100 of the parallel tuned circuit. The other lead 102 from the tuned circuit is connected to the doped solder joints of all of the assemblies 91 through 94. With this arrangement, considerable power at a substantial voltage level is available at the output terminals 104 and 106 of the secondary winding of transformer 98. It may also be noted that, depending on the values employed in the tuned circuit, oscillations may be produced at frequencies up to and even above 2000 megacycles. At frequencies in the kilomegacycle range, resonant cavity and waveguide techniques may be employed to implement the oscillator circuit.

In addition to the basic modes of operation of the circuits of the present invention as described above, it is important to consider a few of their ramifications. In connection with the circuit of FIG. 1, for example, it is desirable that the variable resistance 108 be included in the tuned circuit, preferably connected in parallel with the variable capacitor 20 and the primary 24 of the transformer 22. With this arrangement, the load line may be shifted in position with respect to the negative resistance portion of the diode characteristic as shown in FIG. 4, so that proper oscillation conditions are established. In addition, the capacitor 20 in FIG. 1 is variable to permit shifting of the frequency of oscillation. At very high frequencies, for example, in the hundreds of megacycles, or in the kilomegacycle frequency range, the capacitance 20 can be reduced to zero. Under these circumstances, the inherent capacitance of the diode 12, 16 provides the necessary capacitive reactance for the tuned circuit.

The circuit of FIG. 9 may also be provided with a variable resistance 112 in the tuned circuit. In addition, a neon lamp 114 is shown coupled to the secondary of the transformer 68. Other load circuits such as antennae, and so forth may be substituted for or energized in common with the neon lamp. The energization of a neon lamp from a low direct current source is, however, of particular interest. A neon lamp provides a bright light source with a relatively low input power. Thus, for example, a commercial neon lamp of the NE–51 type requires only 0.040 watts of power. Unfortunately, however, a threshold voltage of 80 volts is required for the excitation of this type of neon lamp. The step-up transformer 68 of FIG. 9 readily transforms the low voltage oscillations in the tuned circuit into sufficiently high voltage alternating current to energize the neon lamp 114. The very low power requirements of .040 watt make this circuit particularly useful for situations where a limited amount of power is available. Furthermore, when very high oscillation frequencies are employed, the tuned circuit including the step-up transformer and the Esaki diode may have a total space requirement about equal to the size of a standard pencil eraser.

It is to be understood that the above described arrangements are illustrative of the application of the principles of the invention. Numerous other arrangements may be devised by those skilled in the art without departing from the spirit and scope of the invention.

What is claimed is:

1. A self-powered semi-conductor oscillator including in combination a narrow junction degenerate semi-conductor diode exhibiting a negative resistance region at the low forward range of its current voltage characteristic, said diode comprising a body of semi-conductive material of one conductivity type and semi-conductive material of the other conductivity type making up said narrow junction diode, and means comprising semi-conductive material of said other conductivity type forming a second junction with said body, said second junction generating a voltage within said low forward range in response to radiant energy impinging on the semi-conductor material of said other type forming said second junction.

2. A self-powered semi-conductor oscillator including in combination a narrow junction degenerate semi-conductor diode exhibiting a negative resistance region at the low forward range of its current voltage characteristic, said diode comprising a body of semi-conductive material of one conductivity type and semi-conductive material of the other conductivity type making up said narrow junction diode, means comprising semi-conductive material of said other conductivity type forming a second junction with said body, said second junction generating a voltage within said low forward range in response to radiant energy impinging on the semi-conductor material of said other type forming said second junction, a tuned load circuit, and means for coupling said tuned load circuit across said diode junction.

3. A self-powered semi-conductor oscillator including in combination a narrow junction degenerate semi-conductor diode exhibiting a negative resistance region at the low forward range of its current voltage characteristic, said diode comprising a body of semi-conductive material of one conductivity type and semi-conductive material of the other conductivity type making up said narrow junction diode, means comprising semi-conductive material of said other conductivity type forming a second junction with said body, said second junction generating a voltage within said low forward range in response to radiant energy impinging on the semi-conductor material of said other type forming said second junction, means for applying radiant energy to said second junction, a tuned load circuit, and means for coupling said tuned circuit across said diode junction.

4. A self-powered semi-conductor oscillator including in combination a narrow junction degenerate semi-conductor diode exhibiting a negative resistance region at the low forward range of its current voltage characteristic, said diode comprising a body of semi-conductive material of one conductivity type and semi-conductive material of the other conductivity type making up said narrow junction diode, and means comprising semi-conductive material of said other conductivity type forming a second junction with said body, said second junction generating a voltage within said low forward range in response to radiant energy impinging on the semi-conductor material of said other type forming said second junction, and said semi-conductive material of said other conductivity type forming said second junction being a thin layer of semi-conductive material which is translucent to sunlight.

5. A self-powered semi-conductor oscillator including in combination a narrow junction degenerate semi-conductor diode exhibiting a negative resistance region at the low forward range of its current voltage characteristic, said diode comprising a body of semi-conductive material of one conductivity type and semi-conductive material of the other conductivity type making up said narrow junction diode, means comprising semi-conductive material of said other conductivity type forming a second junction with said body, said second junction generating a voltage within said low forward range in response to radiant energy impinging on the semi-conductor material of said other type forming said second junction, and means for shielding said diode junction from sunlight.

6. A self-powered semi-conductor oscillator including in combination a narrow junction degenerate semi-conductor diode exhibiting a negative resistance region at the low forward range of its current voltage characteristic, said diode comprising a body of semi-conductive material of one conductivity type and semi-conductive material of the other conductivity type making up said narrow junction diode, means comprising semi-conductive material of said other conductivity type forming a second junction with said body, said second junction generating a voltage within said low forward range in response to radiant energy impinging on the semi-conductor material of said other type forming said second junction, a tuned load circuit comprising a capacitor and a step-up transformer having two primary windings and a secondary winding, means for coupling said capacitor and one of said primary windings in parallel across said diode junction, a modulation circuit coupled to the other primary winding, an antenna coupled to the secondary winding of the transformer, and means connecting said tuned load circuit to said diode junction.

7. A self-powered semi-conductor oscillator including in combination a narrow junction degenerate semi-conductor diode exhibiting a negative resistance region at the low forward range of its current voltage characteristic, said diode comprising a body of semi-conductive material of p-conductivity type and semi-conductive materal of n-conductivity type making up said diode junction, means comprising semi-conductive material of n-conductivity type forming a second junction with said body, said second junction generating a voltage within said low forward range in response to radiant energy impinging on the n-conductivity material of said second junction.

References Cited in the file of this patent

UNITED STATES PATENTS

| | | |
|---|---|---|
| 2,469,569 | Ohl | May 10, 1949 |
| 2,622,116 | Maize | Dec. 16, 1952 |
| 2,914,665 | Linder | Nov. 24, 1959 |
| 2,944,165 | Stuetzer | July 5, 1960 |

OTHER REFERENCES

"Tubeless Oscillator Uses A IN34 Crystal," Turner, Radio-Electronics, October 1949.

"Tunnel Diodes as High-Frequency Devices," Sommers, Jr., Proceedings of the IRE, July 1959.

"Tunnel Diode, Big Impact?," Electronics, Aug. 7, 1959.

"Tunnel Diode, New Electronic Work Horse!," Electronic Industries, August 1959.

Miller: IBM Technical Disclosure Bulletin, vol. 3, No. 4, September 1960.